US006571474B1

(12) United States Patent
Onda et al.

(10) Patent No.: US 6,571,474 B1
(45) Date of Patent: Jun. 3, 2003

(54) METHOD OF FABRICATING A RECORDING HEAD OF ELECTROSTATIC ATTRACTION TYPE IMAGE RECORDING APPARATUS

(75) Inventors: Hiroshi Onda, Yamatokoriyama (JP); Norihiro Ochi, Yamatokoriyama (JP); Hisashi Yoshimura, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/519,853

(22) Filed: Mar. 6, 2000

Related U.S. Application Data

(62) Division of application No. 08/891,635, filed on Jul. 11, 1997, now Pat. No. 6,091,435.

(30) Foreign Application Priority Data

Jul. 12, 1996 (JP) ........................................... 8-182950

(51) Int. Cl.[7] .......................... B21D 53/76; H05K 3/10

(52) U.S. Cl. ........................ 29/890.1; 29/846; 29/831; 430/320; 205/118

(58) Field of Search ............................... 29/611, 890.1, 29/25.35, 846, 829, 831, 842; 430/320; 337/109; 347/43, 55, 141, 115, 116, 151; 358/500; 205/118

(56) References Cited

U.S. PATENT DOCUMENTS 4,423,401 A * 12/1983 Mueller .................. 337/109 X
4,806,956 A 2/1989 Nishikawa et al.
4,891,014 A * 1/1990 Simpson et al. .......... 29/846 X
5,546,655 A * 8/1996 Feger et al. .................. 29/846
5,914,218 A * 6/1999 Smith et al. ................ 430/320

FOREIGN PATENT DOCUMENTS

JP 36-13768 8/1961
JP 2-144987 * 6/1990 .................. 29/829
JP A-7223317 8/1995

* cited by examiner

*Primary Examiner*—A. Dexter Tugbang
(74) *Attorney, Agent, or Firm*—Birch, Stewart, Kolasch, & Birch, LLP.

(57) ABSTRACT

A method of fabricating a recording head is disclosed in which a needle-type control electrode is formed integrally with the substrate. The method includes steps of forming on a substrate a first member layer having a pattern such that the substrate is partially exposed. Forming a second member layer spanning a portion of the exposed substrate and a portion of the first member layer. Then, a needle-type member is formed from the second member layer. Finally, the basic portion of the recording head is completed just by joining the substrate and an overhead plate. Thus, there is no need to join the needle-like control electrode with the substrate. There is no need to position members having critical dimensions with each other.

4 Claims, 9 Drawing Sheets

METHOD OF FABRICATING A RECORDING HEAD OF ELECTROSTATIC ATTRACTION TYPE IMAGE RECORDING APPARATUS

This application is a divisional of Application Ser. No. 08/891,635, filed on Jul. 11, 1997 now U.S. Pat. No. 6,091,435, the entire contents of which are hereby incorporated by reference.

BACKGROUND OF THE INVENTION

1. Field of the Invention

The present invention relates to a recording head of an electrostatic attraction type image recording apparatus used in printers, facsimiles, and the like. More particularly, the present invention relates to a recording head of an electrostatic attraction type image recording apparatus that can be manufactured at low cost.

2. Description of the Background Art

Various image recording devices are known which use conventional recording head such as an ink jet printer. One such device uses a pressure chamber wall that mechanically deforms to reduce the volume of the pressure chamber and eject ink system of transferring ink for printing on a print medium. Also, a bubble jet type image recording apparatus is well known that utilizes vaporization of ink heated instantaneously with a heater to increase pressure in the pressure chamber to transfer ink.

A system for printing on a print medium, not by crating pressure change to transfer ink, but by drawing ink by electrostatic attraction induced by introducing charge into conductive ink is defined in Japanese Patent Publication No. 36-13768. According to this system, ink is not sprayed and instead is attracted onto a print medium (recording medium) for printing (recording) by an electrostatic force exerted on the ink by applying a voltage between a record (control) electrode and an opposite electrode.

An improvement of the above electrostatic attraction type recording apparatus is disclosed in Japanese Patent Laying-Open No. 7-223317. This apparatus has a needle-like control electrode provided at the ink outlet as a record (control) electrode.

Although the diameter of an ink droplet from an ink jet printer that has ink transferred by a pressure change in the pressure chamber depends upon physical properties such as the surface tension of ink and the like, it is greater than the diameter of the orifice from which ink is ejected.

Since the transferred ink spreads 2–3 times the sprayed-out ink diameter on a recording medium such as a paper sheet, the diameter of the ink dot on the recording medium becomes considerably greater than the diameter of the orifice.

In a printer that uses a piezoelectric element as a pressure generation source, the head size cannot be reduced since it is difficult to miniaturize the piezoelectric element. The nozzle could not be provided at high integration, thus causing the problem that the print out speed is low.

In a bubble jet type printer, the temperature of the ink is altered suddenly and repeatedly. This has caused problem that the ink quality is degraded and the life time of the heater is not sufficient.

In an electrostatic attraction type image recording apparatus, the charge injected into conductive ink is attracted towards the opposite electrode by electrostatic force. The ink is pulled in a string-like manner to arrive at the printing face of a recording medium in a particle form or still in the string-like form. The droplet or string of ink can be adjusted to be as small as approximately 10 $\mu$m in diameter, thereby enabling the highprint quality.

Furthermore, such an apparatus is basically implemented by electrodes for generating an electric field between the orifice and the recording medium. Therefore, the structure thereof is extremely simple.

However the ink cannot be stably provided in a string-like manner just by applying voltage between the electrodes. When voltage is applied across the electrodes, charge is injected into the conductive ink, whereby the charge is concentrated at the leading end of the ink. Since the surface of the ink is concave within the nozzle due to surface tension, the charge will be concentrated on the perimeter of the orifice. The ink could be drawn out from anywhere on the circumference. There is a possibility that a plurality of strings of ink will be generated from one orifice, thereby significantly degrading the quality of the printout.

In view of the foregoing, there are several electrostatic attraction systems as set forth in the following that has a convex meniscus formed to stably generate string-like ink.

One system forms a convex meniscus by setting the ink tank higher than the orifice, or by constantly applying static pressure from the backside of the pressure chamber. Another system forms a convex meniscus by generating a traveling wave in the ink or by applying pressure periodically to the pressure chamber by an actuator such as a piezoelectric element. Voltage is applied in synchronization thereof to generate ink in a string-like manner.

The former system is disadvantageous in that ink will leak out from the orifice when the balance between the static pressure and the ink surface tension is destroyed, since a convex meniscus is constantly formed. There is also a disadvantage that, when a foreign object such as a paper particle is attached at the neighborhood of the orifice, ink will leak out through the foreign object.

Also, there is a limit in recording at high frequency since there is some time period before the initial meniscus status is restored. The ink consumed by being transferred out is supplied again by hydrostatic pressure, whereby the initial meniscus status is restored. Furthermore, since the electrodes are provided in the neighborhood of the meniscus, there is a problem that charge injection is too slow in effecting high frequency drive.

The problem of ink leakage is not so serious in the latter system. However, the latter system further requires a device to form a convex meniscus in addition to the electrodes, and lacks the advantage of a simple structure of the electrostatic attraction system. Thus, such a design is inferior in regard to cost and size of the image recording apparatus.

Japanese Patent Laying-Open No. 7-223317 discloses an image recording apparatus having a structure in which a needle-like member is provided at the ink outlet. Ink travels along the needle-like member by means of surface tension to promote refill of the meniscus. The needle-like member can also be used as an electrode to reduce the time required for introducing charge.

The disadvantage of the image recording apparatus described in Japanese Patent Laying-Open No. 7-223317 is as follows. According to the disclosed embodiment, the needle-like member is formed by providing a plurality of layers of a metal material by means of plating. The needle-like member has a diameter of 20 $\mu$m and a length which is the sum of the portion protruding 30 $\mu$m from the orifice, the thickness of the overhead plate, and the portion in the cavity. In a general structure, the length of the needle-like member is as long as 100 $\mu$m and greater.

In order to provide plating of a small pattern such as several ten μm in diameter, the portion which is not to be plated is covered with a resist film and the like by photolithography. Then, plating is carried out.

However, it is extremely difficult to achieve accurately a resist pattern of a high aspect ratio having 20 μm in diameter and at least 100 μm in height.

At the final stage of connecting the needle-like member and the overhead plate, there is a problem that the extremely fine needle-like member is damaged, thereby degrading the yield of the head fabrication cost and increasing. Furthermore, since the positioning of the connection cannot be carried out precisely, the needle-like member may deviate from the center and result in an asymmetrical meniscus configuration. This causes the problem that the spraying direction of the ink is not stable, thereby possibly degrading the print quality.

SUMMARY OF THE INVENTION

An object of the present invention is to provide a recording head that can have fabrication cost reduced.

Another object of the present invention is to provide a recording head used in a recording apparatus suitable for high quality and high speed printout, and that can reliably prevent damage of a control electrode.

A further object of the present invention is to provide a method of fabricating a recording head that allows simplification of the fabrication process.

Still another object of the present invention is to provide a method of fabricating a recording head that can easily produce a small projection of a high aspect ratio.

The above objects of the present invention can be achieved by a recording head used in a recording apparatus as set forth in the following.

A recording head used in a recording apparatus according to an aspect of the present invention is a recording head of a recording apparatus that has a control electrode and an opposite electrode facing each other for carrying out printing by applying a predetermined potential between the electrodes to transfer ink from the control electrode side to the opposite electrode side. A recording medium is connected to the opposite electrode. The recording head includes an opening located opposite to the opposite electrode, and an ink holding portion for holding ink.

The ink holding portion includes a substrate for holding the control electrode, and a cover plate joined to the substrate. The control electrode includes a needle-like portion protruding parallel to the substrate, and in a direction crossing the opening.

Since the control electrode is provided as described above, damage of the control electrode can be reliably prevented. Thus, a recording head used in a recording apparatus is provided that allows the fabrication cost to be reduced.

According to another aspect of the present invention, a method of fabricating a recording head includes the steps of forming, on a substrate, a first member layer having a pattern in which the substrate is partially exposed, forming a second member layer differing from the first member layer so as to span a portion of the exposed substrate and at least one portion of the first member layer, whereby a needle-like member is formed from the second member layer.

Since the needle-like member which functions as a needle-like control electrode is produced according to the above steps, the needle-like member is formed integrally with the substrate. Since the basic portion of the recording head is completed just by joining the substrate which is integral with the needle-like control electrode and the overhead plate, the fabrication step of joining the needle-like control electrode with the substrate can be eliminated. The difficult step of positioning the members of critical dimension with each other is not required. The fabrication process of the recording head is simplified to improve the productivity. Therefore, the fabrication cost can be reduced.

Furthermore, the relative position of the needle-like control electrode in the vertical direction to the ink outlet can easily be adjusted to a desired dimension ratio.

According to yet another aspect of the present invention, a method of fabricating a recording head includes the steps of preparing a substrate, joining, on the substrate, a wall unit having a cylindrical groove and a longitudinal groove provided continuous to the cylindrical groove, forming a needle-like control electrode on the substrate and within the cylindrical groove, and joining a plate on the wall unit and at a portion where the cylindrical groove is not provided.

A cylindrical groove serving as a nozzle of the recording head and a longitudinal groove serving as an ink path are formed as described above. Since the nozzle is formed of a member identical to that of the ink path, an orifice plate is not required. The length of the needle-like member can be made to correspond only to the thickness of the wall unit forming the nozzle.

According to the above-described fabrication steps, a recording head can be formed by just sequentially joining the wall unit and the like having a predetermined configuration. Therefore, the fabrication cost can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
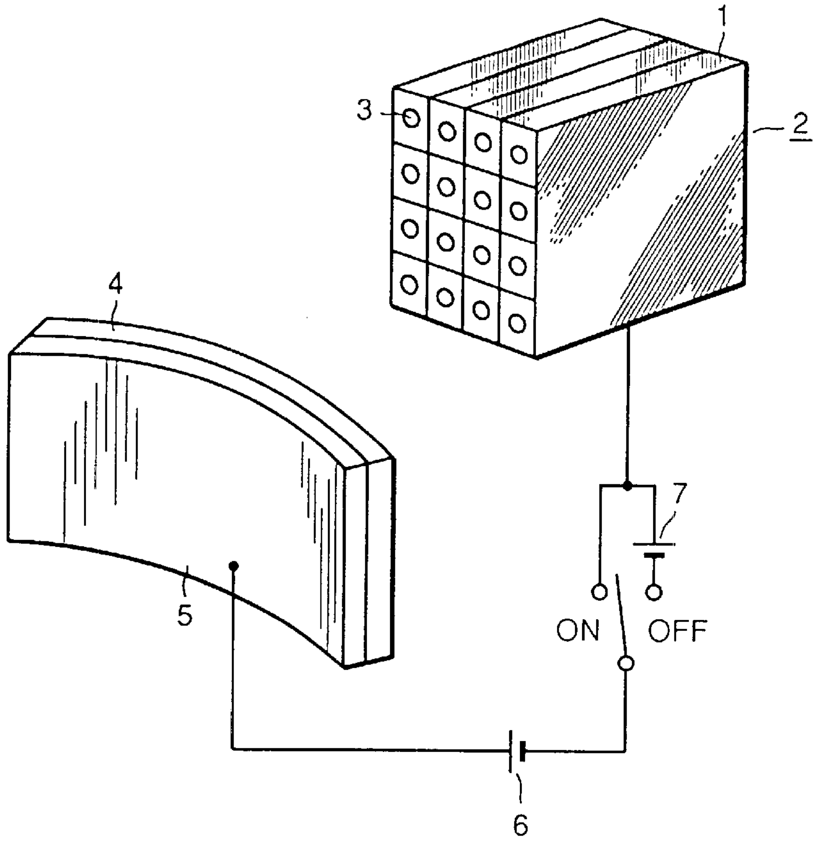
FIG. 1 is a schematic diagram showing an electrostatic attraction type recording apparatus using a recording head of the present invention.

Referring to FIG. 1, an electrostatic attraction type image recording apparatus in which a recording head of the present invention is applied includes a head unit 2 with a recording head 1 of 4 colors, and a recording medium 4 provided facing a plurality of ink outlets 3 formed at a side surface of head unit 2. Recording medium 4 and an opposite electrode 5 are provided facing each other.

In the present structure, ink head 1 forming head unit 2 may include only a single color such as black. Recording medium 4 may be a medium such as a sheet of paper to which the final output is provided, or an intermediate transfer medium. When recording medium 4 is an intermediate transfer medium, transfer means such as a transfer roller and a cleaning mechanism of the intermediate transfer medium (not shown in FIG. 1) will be necessary.

A bias voltage 6 is applied to all the channels of recording head 1. Also, a select signal 7 is applied to the channel that attracts ink.

Figure 23:
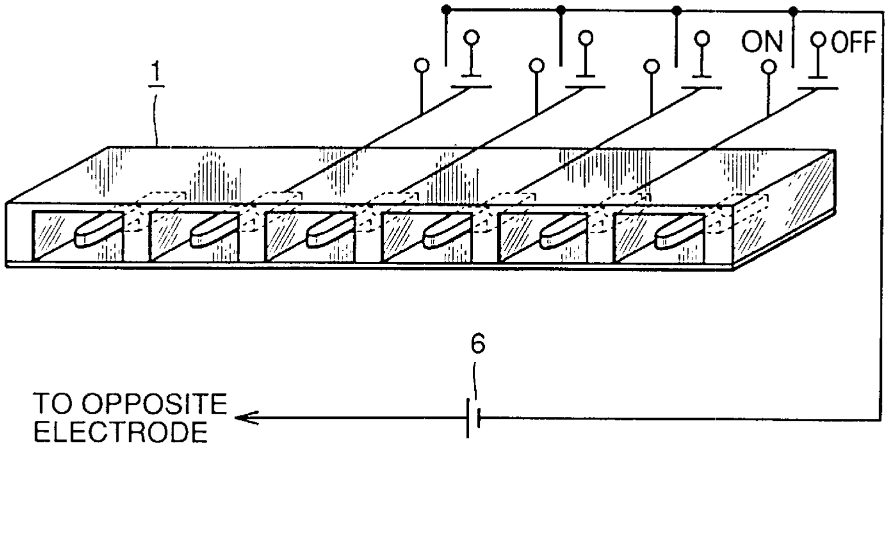
FIG. 23 is a perspective view of actual recording heads.

FIG. 23 is a schematic drawing showing an actual connection of the recording head 1. Each control electrode 10 is connected with each switch shown in FIG. 1.

Figure 2:
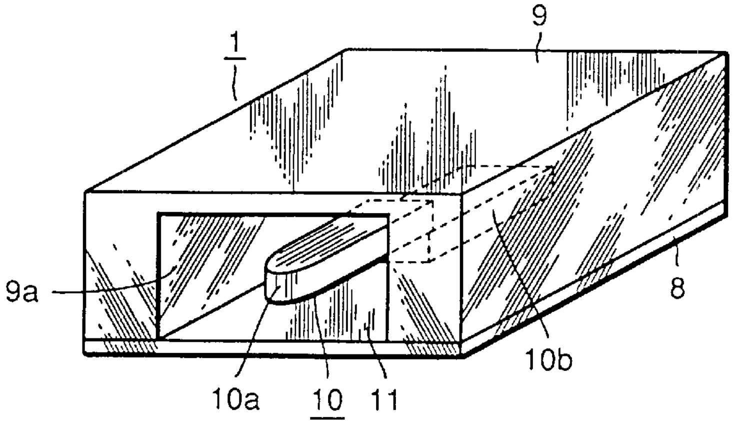
FIG. 2 is a perspective view of a recording head according to a first embodiment of the present invention.

FIG. 2 shows a recording head according to a first embodiment of the present invention. Recording head 1 includes a substrate 8, an overhead plate 9 forming a groove 9*a,* and a flat needle-like control electrode 10. Ink is ejected from an ink outlet 11 provided at a side face of recording head 1. Needle-like control electrode 10 is formed parallel to substrate 8.

The longitudinal axis of needle-like control electrode 10 and ink outlet 11 both conform to the horizontal direction of substrate 8. Needle-type control electrode 10 is formed of a conductive material that has favorable wettability to ink. Preferably, the conductive material is exposed only at the leading end portion of control electrode 10 in the proximity of ink outlet 11. The remaining portion of control electrode 10 is covered with an insulative material. The portion where the conductive material is exposed corresponds to the non-contact portion 10*a* that does not form contact with substrate 8. The portion covered with the insulative material corresponds to contact portion 10*b* that is brought into contact with substrate 8.

Needle-like control electrode 10 is formed so that its leading edge becomes finer towards outlet 11 to promote refill of ink. Charge is introduced to the conductive ink from needle-like control electrode 10 according to an image signal. The charge is attracted to opposite electrode 5 by coulomb force to result in generation of stringy ink.

Overhead plate 9 has a groove 9*a* formed at the side of substrate 8. Overhead plate 9 is joined from above of substrate 8, positioned using a microscope. Groove 9*a* of overhead plate 9 provides an ink path (ink chamber). One side face of this ink path corresponds to ink outlet 11.

Figure 3:
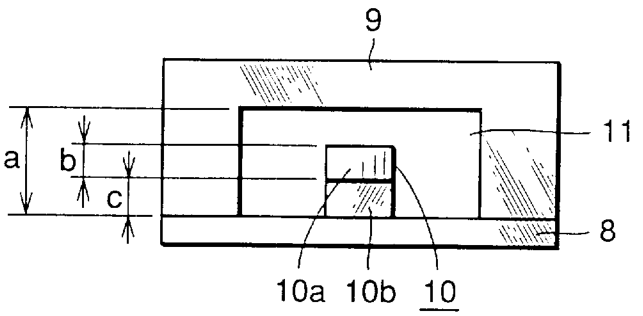
FIG. 3 is a front view of the recording head of the first embodiment of the present invention.

FIG. 3 shows a front view of recording head 1 viewed from the side of ink outlet 11. The opening of ink outlet 11 has a dimension a of 70 μm. The thickness b of needle-like control electrode 10 is 25 μm. The gap c between needle-like control electrode 10 and substrate 8 is set to 20 μm.

The distance between substrate 8 and the surface of needle-like control electrode 10 closest to substrate 8 is 20 μm. The distance between substrate 8 and the surface of needle-like control electrode 10 most remote from substrate 8 is 45 μm.

In the plating process, a standard dry film resist that is commercially available can be used if the thickness of the plate film is not more than 50 μm. Plating can be effected easily to allow reduction in the cost. Patterning using a resist that is 50 μm and smaller according to photolithography can be effected with no problem from the standpoint of patterning accuracy.

Figure 4:
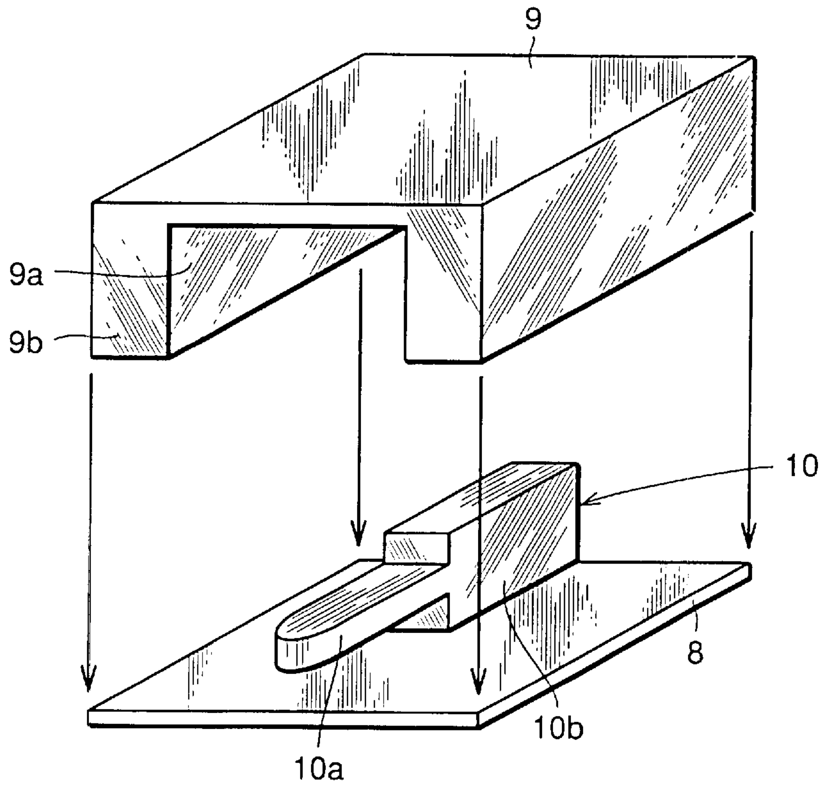
FIG. 4 is an exploded perspective view of a recording head according to a second embodiment of the present invention.
Figure 5:
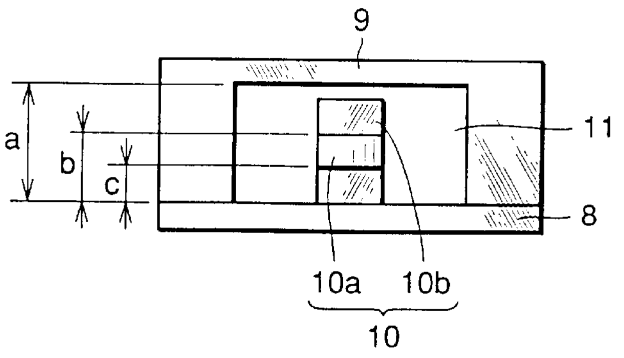
FIG. 5 is a front view of the recording head of FIG. 4.

Referring to FIGS. 4 and 5 showing a recording head of a second embodiment of the present invention and ink outlet 11, contact portion 10*b* of needle-like control electrode 10 is formed thicker than non-contact portion 10*a.*

Contact portion 10*b* of needle-like control electrode 10 is formed thicker than the height d (refer to FIG. 5) of non-contact portion 10*a* from substrate 8, and smaller than the opening dimension a of ink outlet 11. Contact portion 10*b* is formed to have a film thickness of 40–60 μm.

Since contact portion 10*b* of needle-like control electrode 10 has a film thickness (height) thicker (higher) than non-contact portion 10*a,* the junction portion 9*b* of overhead plate 9 with substrate 8 will not come into contact with non-contact portion 10*a* of needle-like control electrode 10 in the coupling process of overhead plate 9 and substrate 8. Therefore, damage of needle-like control electrode 10 is prevented.

Figure 6:
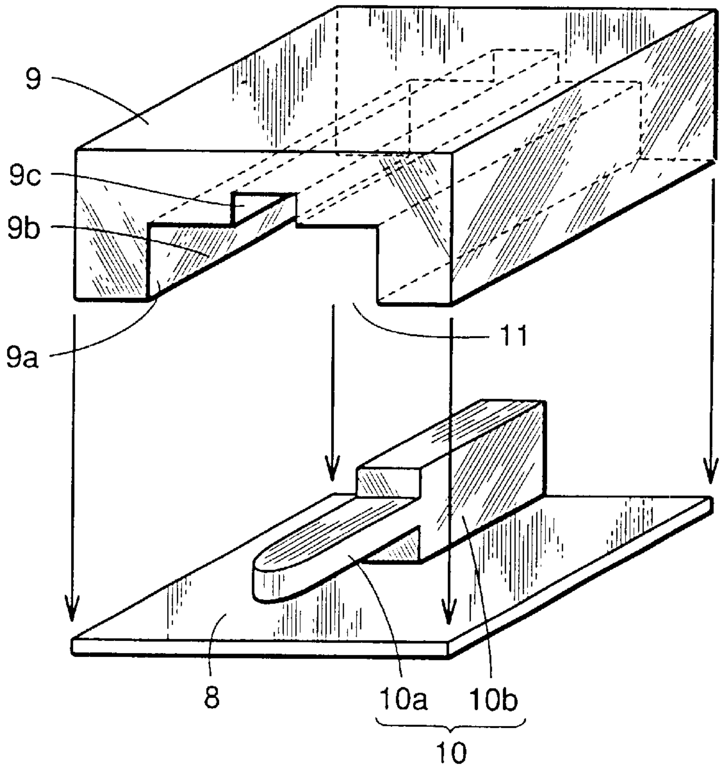
FIG. 6 is an exploded perspective view of a recording head according to a third embodiment of the present invention.
Figure 7:
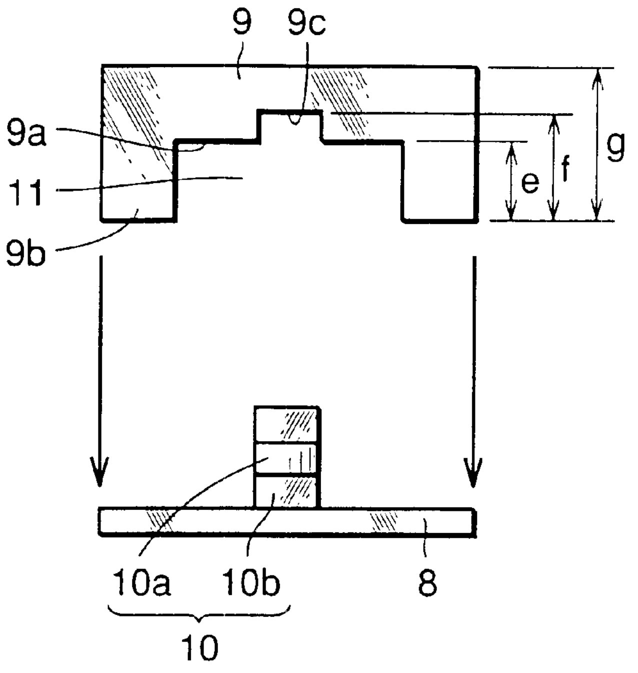
FIG. 7 is an exploded front view of the recording head of FIG. 6.

Referring to FIGS. 6 and 7 showing a recording head according to a third embodiment of the present invention and ink outlet 11, groove 9*a* of overhead plate 9 is formed in a 2-stage manner. In FIG. 7, the first groove 9*a* is formed to have a depth e of 70 μm, and the second groove 9*c* is formed to have a depth f of 80 μm.

Contact portion 10*b* of needle-like control electrode 10 is formed thicker than non-contact portion 10*a.* Contact portion 10*b* is formed to have a film thickness greater than the depth e of first groove 9*a,* and smaller than the thickness g of overhead plate 9.

Since contact portion 10*b* of needle-like control electrode 10 is formed thicker than non-contact portion 10*a,* thicker (greater) than the depth e of first groove 9*a* of overhead plate 9, and thinner than the thickness g of overhead plate 9, junction portion 9*b* of overhead plate 9 will not come into contact with non-contact portion 10*a* of needle-like control electrode 10 at the coupling process of overhead plate 9 and substrate 8. Therefore, damage of needle-like control electrode 10 is prevented. Since contact portion 10*b* of needle-like control electrode 10 fits with second groove 9*c* of overhead plate 9, the positioning between substrate 8 and overhead plate 9 in the coupling process is facilitated to improve the process efficiency for fabrication.

Figure 8:
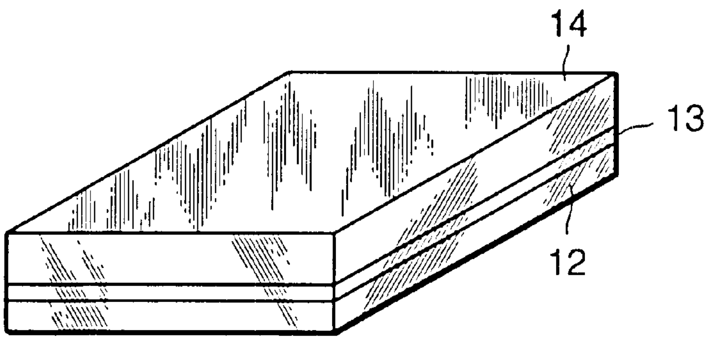
FIGS. 8–15 are perspective views of a recording head of the present invention representing first to eighth steps, respectively, of a fabrication process.

FIGS. 8–16 represent the fabrication process of a recording head according to a fourth embodiment of the present invention. Referring to FIG. 8, an underlying plate 13 is formed on a glass substrate 12 by sputtering, vaporization, and the like. Then, a dry film resist is laminated on underlying plate 13 to form a laminate body 14. The laminate is provided at the condition of, for example, 0.5 m/minutes and 3.0 kg/cm$^2$ at the temperature of 105° C.

Figure 9:
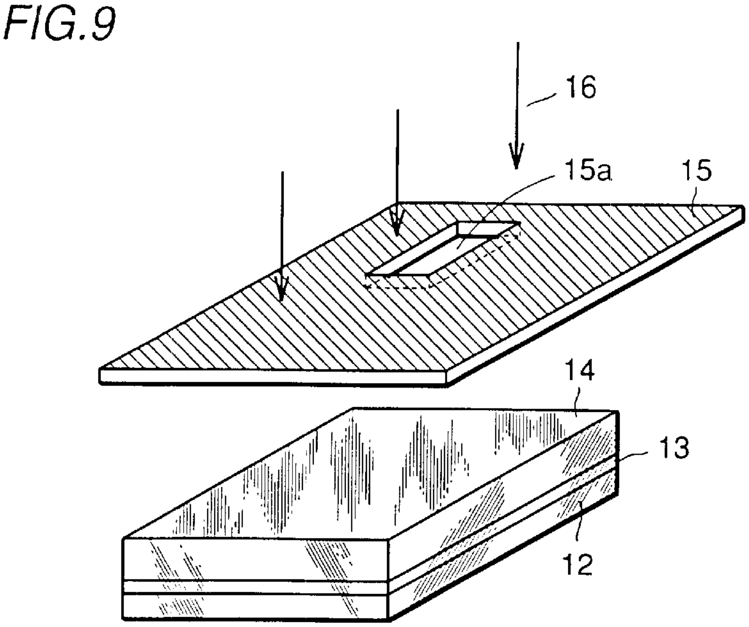
Figure 10:
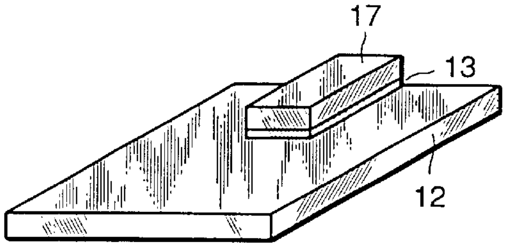

Referring to FIG. 9, a photomask 15 formed with a predetermined pattern is overlaid on or provided in the proximity of laminate body 14. Exposure is carried out by ultraviolet ray 16. The energy density thereof is, for example, 200 mJ/cm$^2$. Ultraviolet ray 16 passing through a transparent portion 15*a* of photomask 15 exposes the area of the dry film resist corresponding to transparent portion 15*a*. The remaining portion is not exposed since ultraviolet lay 16 is blocked by photomask 15.

By removing the non-exposed portion of the dry film resist with a predetermined developing agent formed of xylene and butylcellosolveacetate, the exposed portion of the dry film resist remains on underlying plate 13 as a solid layer 17, whereby substrate 8 (glass substrate 12) is formed.

The subsequent process will be described hereinafter with reference to FIG. 11. It is to be noted that underlying plate 13 will not be depicted in the drawing.

By applying Zn plating on substrate 8 obtained by the preceding fabrication steps, Zn is deposited excluding the region of the dry film solid layer 17. By terminating the plating process when the Zn layer is equal to the thickness of solid layer 17 of the dry film by controlling the plating time period of Zn, a flat plane of the dry film resist and Zn is provided.

Figure 11:
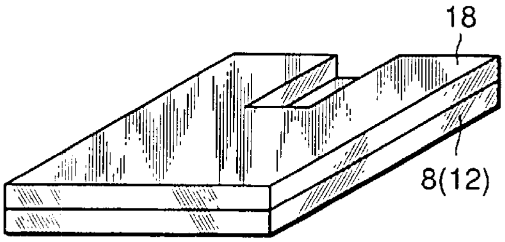

Then, the dry film resist is removed by a release agent to form a Zn layer 18 of the configuration shown in FIG. 11.

Figure 12:
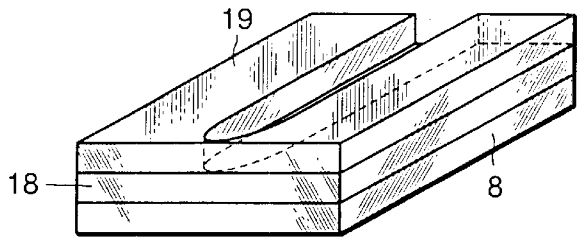

Then, a solid layer 19 of a dry film resist is formed on Zn layer 18 as shown in FIG. 12 according to a fabrication process similar to those of FIGS. 8 and 9.

Figure 13:
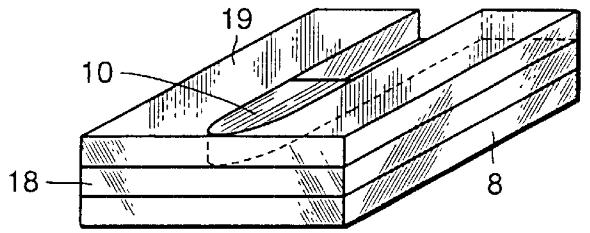

Referring to FIG. 13, a layer of Ni or Ti superior in ink-resistance is formed to a predetermined thickness of 20 μm by electroplating. This plating is carried out on Zn layer 18 provided by the previous step and underlying plate 13 on substrate 8 to result in formation of needle-like control electrode 10 of Ni or Ti spanning therebetween.

Figure 14:
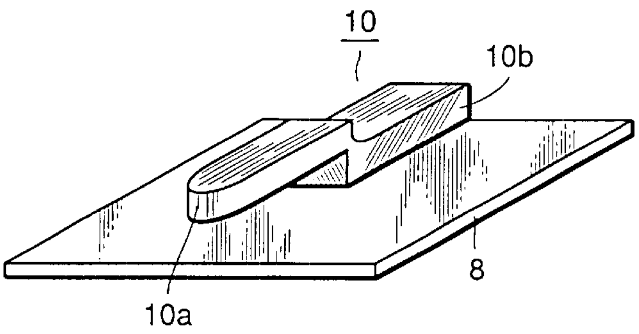

Then, substrate 8 is dipped into a KOH solution to have the dry film resist and Zn dissolved and removed simultaneously. By the preceding steps, a needle-like control electrode 10 constituted by a leading end of a non-contact portion 10*a* attaining a floating state from substrate 8 and a contact portion 10*b* integral with substrate 8 is formed as shown in FIG. 14.

Figure 15:
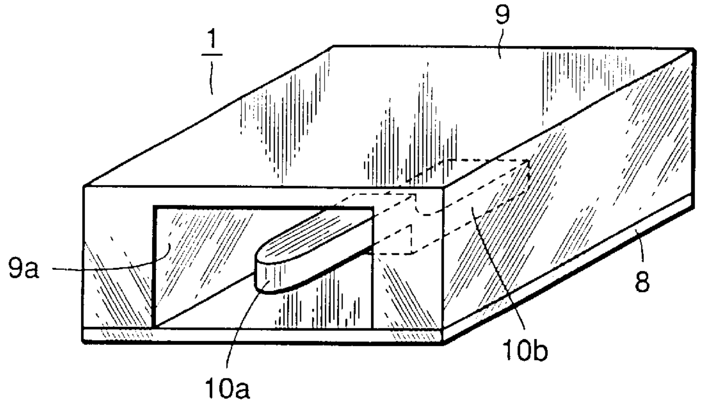

Then, overhead plate 9 with a concave groove 9*a* is coupled to substrate 8 to form recording head 1 of the electrostatic attraction type image recording apparatus shown in FIG. 15.

Figure 16:
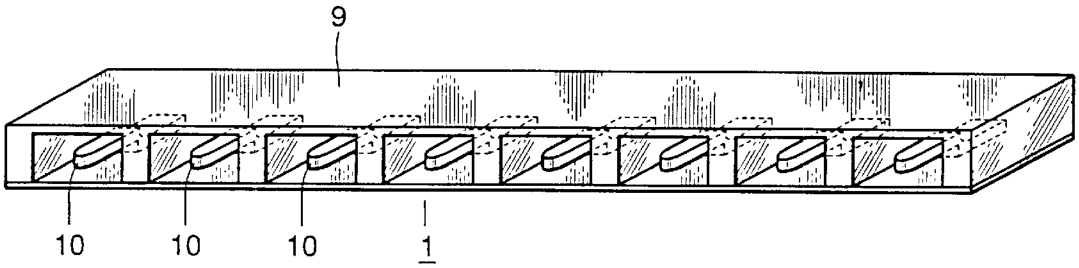
FIG. 16 is a perspective view of a plurality of recording heads according to a method of fabrication of the present invention.

The above description is provided for a single head with reference to the drawings. In practice, a plurality of heads are formed on substrate 8 to provide a recording head 1 as shown in FIG. 16. The structure shown in FIG. 16 is stacked to form the recording head 1 shown in FIG. 1.

According to the above-described method of fabrication, needle-like control electrode 10 is formed integrally with substrate 8 by the patterning of the dry film resist for substrate 8 and metal plating. The basic portion of recording head 1 can be completed just by the coupling of substrate 8 which is integral with needle-like control electrode 10 to overhead plate 9.

Therefore, the coupling process of needle-like control electrode 10 and substrate 8 can be eliminated. It is not necessary to carry out the difficult positioning of the members having critical dimension. The fabrication process of recording head 1 can be simplified to reduce the cost due to improvement of productivity.

The relative position of needle-like control electrode 10 in the vertical direction to ink outlet 11 is set forth in the following. Non-contact portion 10*a* is distant from substrate 8 by the thickness c of the layered Zn plate as shown in FIG. 3. Therefore, the distance from overhead plate 9 to non-contact portion 10*a* corresponds to the difference between the depth a of groove 9*a* of overhead plate 9 and the total thickness of the layered films of Zn and Ni, i.e. a–(b+c). Control can be provided in units of μm. Thus, recording head 1 of a desired dimension ratio can easily be provided.

Furthermore, since needle-like control electrode 10 is formed horizontal to the plane of substrate 8, the thickness of the layered metal plate forming needle-like control electrode 10 can be set to be 50 μm or below. A commercially available resist can be used for the dry film resist forming the wall in the step of applying plating.

The dry film resist of 50 μm in thickness can easily be patterned to have a width of 20 μm. Variation in the dimension of needle-like control electrode 10 can be minimized. The cost can be reduced due to improvement of the fabrication yield of recording head 1. When recording heads corresponding to each color are assembled to form a color recording head, variation in the performance of respective recording heads can be suppressed to improve the printout quality.

Figure 17:
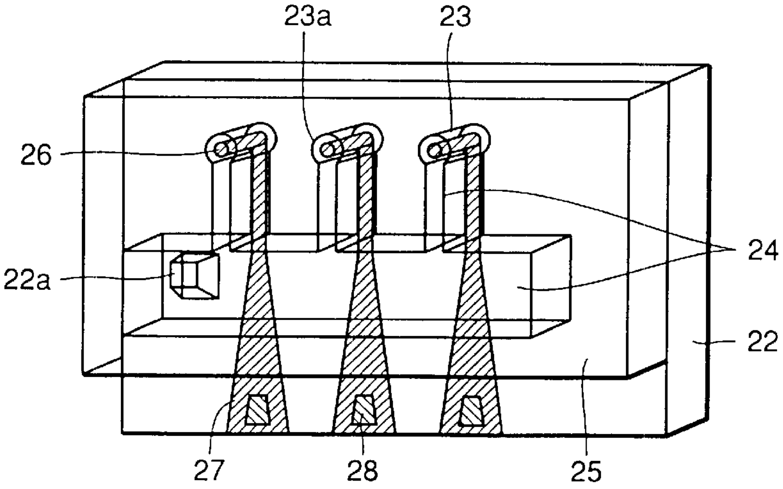
FIG. 17 is a perspective view of a recording head according to another embodiment of the present invention with the overhead plate removed.
Figure 18:
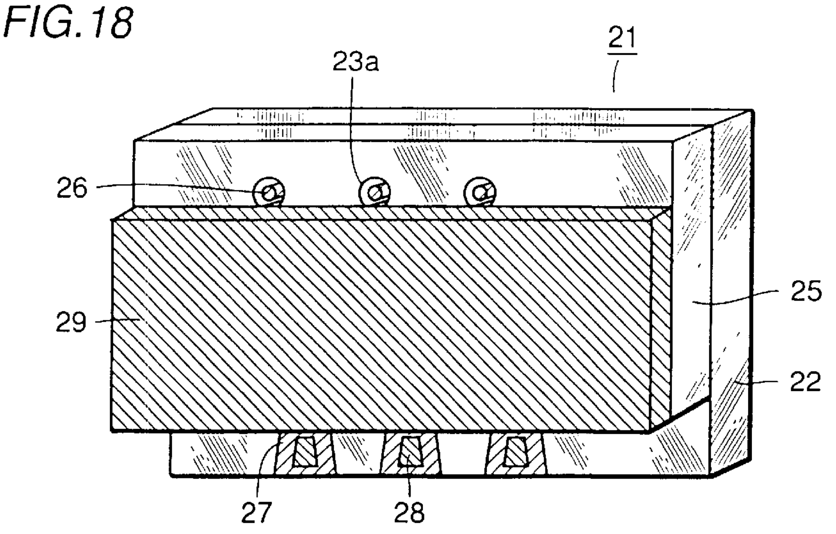
FIG. 18 is a perspective view of the recording head of FIG. 17.

FIGS. 17 and 18 show a recording head 21 according to a fifth embodiment of the present invention. A wall body 25 having a cylindrical nozzle 23 and an ink path 24 (ink chamber) is joined to a substrate 22. A needle-like control electrode 26 is arranged at the center in nozzle 23 of wall body 25. An electrode 27 formed at substrate 22 is connected.

The end opening of nozzle 23 functions as an ink outlet 23*a*. Ink outlet 23*a* is formed at the opposite side to substrate 22. An ink supply opening 22*a* is provided at substrate 22 for supplying ink to ink path 24.

Electrode 27 has the conductor surface exposed only at the contact point with needle-like control electrode 26 in nozzle 23, ink path 24 and an electrode drawing portion 28 outside the member forming nozzle 23. The remaining portion of electrode 27 is covered with an insulative film.

Injection of charge into ink according to an image signal is effected by needle-like control electrode 26 conducting with electrode 27.

An overhead plate 29 which is just a flat plate subjected to no working is joined to substrate 27 of the above-structure so as to close ink path 24 avoiding ink outlet 23*a*. Thus, recording head 21 is formed.

Since nozzle 23 and ink path 24 are formed of the same member, there is no orifice plate. Needle-like control electrode 26 has a length corresponding to only the thickness of wall body 25 forming nozzle 23. Although the structure is provided in which ink outlet 23*a* and needle-like control electrode 26 are positioned perpendicular to substrate 22, the length of needle-like control electrode 26 is set to not more than 50 μm. A small projection of a high aspect ratio can be provided. Thus, the structure of recording head 21 can be simplified.

Figure 19:
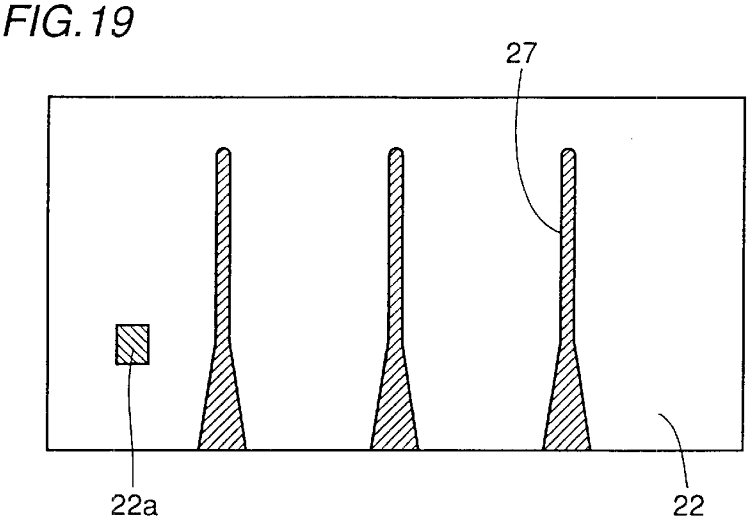
FIGS. 19–22 are perspective views of a recording head according to still another embodiment of the present invention representing first to fourth steps, respectively, of a method of fabrication.

FIGS. 19–22 show the fabrication process of recording head 21 according to a sixth embodiment of the present invention. Referring to FIG. 19, an Si substrate 22 formed of photosensitive glass or having both sides covered with a thin $SiO_2$ layer is subjected to etching to form an ink supply opening 22*a*. Then, a film of Al or Ni is grown by sputtering, vaporization, and the like. Patterning is carried out by photolithography to form an electrode 27.

Then, $SiO_2$ or SiN is sputtered all over on substrate 22 to form an insulation layer.

Figure 20:
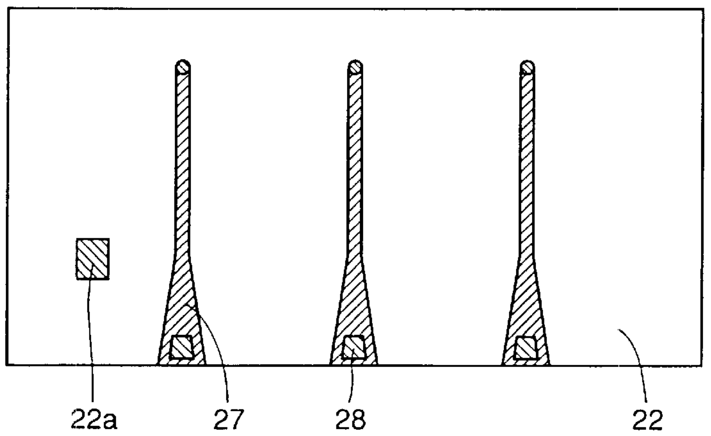

Referring to FIG. 20, according to a patterning step by photolithography, a resist film is formed over electrode 27 except for the 20 μm circular portion at the leading edge and electrode drawout portion 28. Then, dry etching is applied to remove the insulation layer of the leading edge of electrode 27 and electrode drawout portion 28. Then, the resist film is removed.

Figure 21:
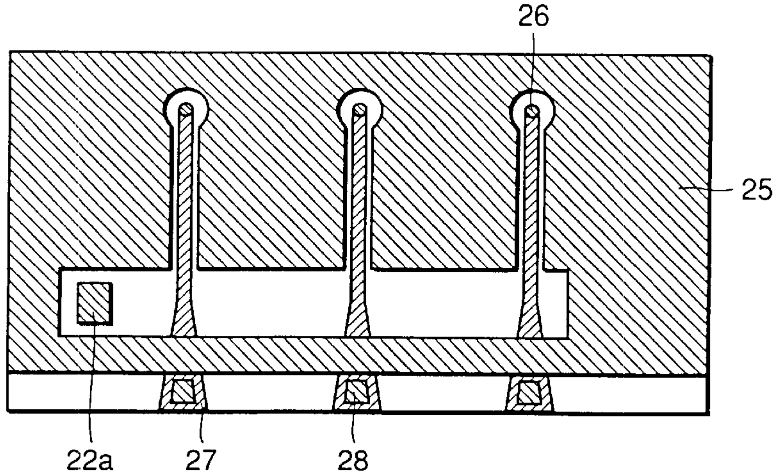

Next, a film of Ni or Ti is grown by sputtering, evaporation, and the like all over substrate 22. Then, patterning is effected by photolithography to obtain a needle and a wall underlying plate. A dry film resist is patterned at the portion corresponding to ink path 24 and nozzle 23 and the neighborhood of electrode drawout portion 28. A film is provided, and Ni plating is applied. Needle-like control electrode 26 at the end of electrode 27 and wall body 25 are formed at the same fabrication step. At this time point, ink path 24, nozzle 23, and needle-like control electrode 26 are formed as shown in FIG. 21.

Figure 22:
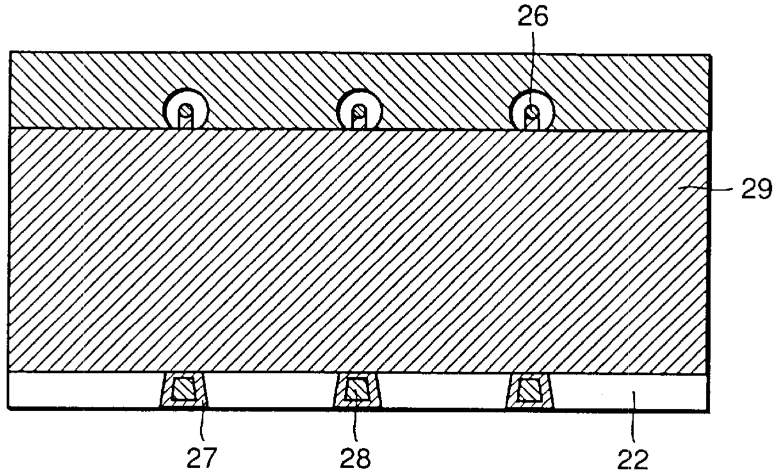

Referring to FIG. 22, overhead plate 29 is joined so as to close ink path 24 avoiding the neighborhood of ink outlet 23*a* where needle-like control electrode 26 is present. Thus, a recording head 21 having an ink outlet 23*a* perpendicular to substrate 22 is formed.

Since needle-like control electrode 26 and ink path 23 are formed integrally at the side of substrate 22, overhead plate 29 may be a flat plate requiring no working. Therefore, the cost required for working is eliminated. Furthermore, the material for overhead plate 29 can be selected from a wider range since it is not necessary to account for workability of the material.

Since overhead plate 29 is just a flat plate, it is not necessary to provide critical positioning of overhead plate 29 and substrate 22. Since the coupling is effected avoiding ink outlet 23a, damage of needle-like control electrode 26 at the time of coupling can be prevented. Also, there is no possibility of an adhesion agent and the like blocking ink outlet 23*a*.

The critical positioning of needle-like control electrode 26 with respect to ink outlet 23*a* is made uniform at all recording heads by virtue of the integral formation. Therefore, the yield and printout quality can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a recording head comprising the steps of:

forming, on a substrate, a first member layer having a pattern exposing said substrate partially, forming a second member layer differing from said first member layer so as to span a portion of said exposed substrate and at least a portion of said first member layer, and removing said first member layer, thus forming a needle-like control electrode of said recording head from said second member layer.

2. The method of fabricating the recording head according to claim 1, wherein said step of forming the first member layer further comprises steps of:

forming an underlying layer plated on said substrate, forming a resist layer on said underlying layer, exposing said resist layer partially and removing a remaining protion of said resist layer not exposed, plating a zinc layer around said resist layer on said substrate, and removing said resist layer.

3. The method of fabricating the recording head according to claim 2, wherein said step of forming the second member layer further comprises a step of forming a layer of a material superior in ink-resistance on said plated underlying layer and partially on said zinc layer.

4. The method of fabricating the recording head according to claim 3, wherein said material superior in ink-resistance is nickel or titanium.

* * * * *